(12) United States Patent
Nakamura et al.

(10) Patent No.: US 6,944,076 B2
(45) Date of Patent: Sep. 13, 2005

(54) DYNAMIC SEMICONDUCTOR MEMORY DEVICE AND BIT LINE PRECHARGE METHOD THEREFOR

(75) Inventors: Yutaka Nakamura, Kyoto (JP); Toshio Sunaga, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,456

(22) Filed: May 6, 2004

(65) Prior Publication Data

US 2004/0223396 A1 Nov. 11, 2004

(30) Foreign Application Priority Data

May 6, 2003 (JP) .................................. 2003-128367

(51) Int. Cl.[7] .............................................. G11C 7/00
(52) U.S. Cl. .................... 365/203; 365/222; 365/229
(58) Field of Search ............................. 365/203, 222, 365/229, 149

(56) References Cited

U.S. PATENT DOCUMENTS

| | | | | |
|---|---|---|---|---|
| 4,907,199 A | * | 3/1990 | Dosaka et al. | 365/189.04 |
| 4,943,952 A | * | 7/1990 | Terayama | 365/207 |
| 5,047,984 A | * | 9/1991 | Monden | 365/203 |
| 5,202,854 A | * | 4/1993 | Koike | 365/203 |
| 5,594,701 A | * | 1/1997 | Asaka et al. | 365/230.03 |
| 6,335,886 B1 | * | 1/2002 | Ochi et al. | 365/200 |

FOREIGN PATENT DOCUMENTS

JP          5-128858          5/1993

* cited by examiner

*Primary Examiner*—Tan T. Nguyen
(74) *Attorney, Agent, or Firm*—Michael J. LeStrange

(57) ABSTRACT

A dynamic semiconductor memory device capable of reducing standby current is disclosed. In a standby mode wherein only a refresh operation is performed, a precharge/equalize signal is activated only during a predetermined period before a word line is activated so as to precharge a bit line pair to a voltage that is half a line voltage immediately before the word line is activated. In the standby mode, the bit line pair is electrically isolated from a regulator that generates a voltage that is half the line voltage except for the above predetermined period, thus preventing leakage current from flowing therebetween even if a defect in which the word line is shorted with the bit lines occurs.

19 Claims, 14 Drawing Sheets

DYNAMIC SEMICONDUCTOR MEMORY DEVICE AND BIT LINE PRECHARGE METHOD THEREFOR

BACKGROUND OF INVENTION

1. Field of the Invention

The present invention relates to a dynamic semiconductor memory device and a bit line precharge method therefor. More particularly, the present invention relates to a dynamic random access memory (DRAM) that performs a refresh operation in a standby mode and a bit line precharge method.

2. Background of the Invention

Reducing power dissipation of integrated circuits in battery-driven equipment, such as a cellular telephone or a personal digital assistant (PDA), is a significant challenge. Previously, static random access memories (SRAMs) have been used extensively in semiconductor memory applications, because a SRAM memory cell typically has six complementary metal oxide semiconductor (CMOS) transistors and allows data to be retained with a minimal amount of current drain. In terms of area, however, the SRAM memory cell, is larger than a DRAM memory cell by a factor of twenty or more. In addition, memory capacities are increasing proportionately with circuit and wiring densities. As such, fabricating a 32-Mbit or 64-Mbit SRAM using current wiring technology of about 0.2 $\mu$m to about 0.13 $\mu$m inevitably results in an excessively large chip. Consequently, from the viewpoint of area efficiency, SRAMs are inferior to DRAMs, and the disadvantage of poor area efficiency ultimately inhibits continued process technology scaling. For this reason, in many applications SRAMs are being replaced by DRAMs.

SUMMARY OF INVENTION

Referring to FIG. 12, a conventional DRAM has a memory cell array 10 that includes memory cells (not shown) disposed in rows and columns, word lines WL disposed in rows, bit line pairs BL, /BL disposed in columns, a row decoder 12 that selectively activates the word lines WL, a sense amplifier 14 that amplifies a potential difference between paired bit lines BL, /BL, a half-Vdd regulator 16 that generates a voltage Vdd/2, which is half a line voltage Vdd, N-channel MOS transistors Q1 to Q3 for precharging the bit line pairs BL, /BL to Vdd/2, and a timing control circuit 18 that controls the sense amplifier 14 and the transistors Q1 to Q3.

The DRAM has a standby mode in addition to an active mode in which the DRAM reads/writes data. In the standby mode, the DRAM does not read or write data at all and performs only a refresh operation to retain currently stored data. The refresh operation is performed at a fixed interval (hereinafter referred to as "refresh cycle"). The refresh operation reads out data once from a memory cell and rewrites data to the memory cell, and it is basically similar to a normal read/write operation.

Still referring to FIG. 12, before the refresh operation, a precharge/equalize signal PC/EQ is at a logic high level, so that the transistors Q1 to Q3 are on, and the bit line pair BL, /BL is precharged to Vdd/2. When the timing control circuit 18 sets the precharge/equalize signal PC/EQ to a logical low level and the row decoder 12 activates the word line WL, data is read from a memory cell, causing a potential difference between the paired bit lines BL, /BL. Then, when the timing control circuit 18 sets a sense amplifier control signal SAC to a logic high level, the sense amplifier 14 is activated. The sense amplifier 14 amplifies the potential difference between the paired bit lines BL, /BL and it raises one of the paired bit lines BL, /BL to the line voltage Vdd, while it lowers the other to a ground voltage GND. This causes data to be rewritten to a memory cell, thus refreshing the data in the memory cell. The timing control circuit 18 resets the sense amplifier control signal SAC to logic low and the row decoder 12 deactivates the word line WL, then the timing control circuit 18 resets the precharge/equalize signal PC/EQ to a logic high. This causes the bit line pair BL, /BL to be precharged to Vdd/2 again. The series of steps from the activation to the deactivation of the word line WL described above is referred to as the "refresh operation." For purposes of the following failure mode analysis, it is assumed that the word line WL is shorted with the bit line /BL by a defect at an intersection X in FIG. 12. Although such a bit line pair BL, /BL is electrically replaced by a redundant bit line pair RBL, /RBL, the bit line pair BL, /BL still physically exists. When the bit line pair BL, /BL is precharged to Vdd/2 while the voltage of the word line WL is at the ground voltage GND, leakage current Id is produced between the bit line /BL and the word line WL. The half-Vdd regulator 16 is always activated, so that leakage current ID flows from the power source toward the ground via the half-Vdd regulator 16, the bit line /BL, and the word line WL. If the efficiency of the half-Vdd regulator 16 is denoted by Re, where (0<Re<1), then the leakage current ID is expressed by Id/Re.

FIG. 14 shows consumption current in the standby mode (hereinafter referred to as "standby current"). If a refresh cycle Tr is, for example, approximately 15.6 $\mu$s in duration, then the time actually required for refresh (hereinafter referred to as "refresh operating period") T1 is about 60 ns in a 0.2 $\mu$m technology. During the refresh operating period T1, a large alternating current AC is required to perform the refresh operation. FIG. 14 shows refresh current RF1 obtained by averaging the alternating current AC by the refresh operating period T1 and refresh current RF2 obtained by averaging the alternating current AC by the refresh cycle Tr. The alternating current AC required for refresh does not flow during a period of 15.54 $\mu$s (hereinafter referred to as "refresh non-operating period") T2 corresponding to 99.6% or more of the refresh cycle Tr. The DRAM, however, has various reference voltage generator circuits in addition to the half-Vdd regulator 16, in its peripheral circuit, so that direct current DC flows during the refresh non-operating period T2. In addition, the aforementioned leakage current ID also flows. Thus, the standby current ST is a sum of the direct current DC, the refresh current RF2, and the leakage current ID.

Since the leakage current ID is attributable to a defect, it is difficult to predict its value. For this reason, a sufficiently large value must be set as a standard value. Furthermore, the leakage current ID may be highly variable, making it difficult to reliably manufacture a DRAM with small leakage current ID over a long time. The leakage current ID may be as large as a few tens of $\mu$A for a DRAM in the range of a few tens of megabits, and even larger for a DRAM in the range of a few gigabits. It is hence predicted that the leakage current ID will be far larger than the refresh current RF2, posing a serious problem for a low-current DRAM aiming at standby current of about 10 $\mu$A.

Japanese Unexamined Patent Application (PUPA) No. 5-128858 discloses a GND precharge method to prevent the leakage current caused by a short-circuit defect as described above. According to the GND precharge method, bit line pairs are precharged to the same ground voltage as that of word lines, in contrast to the half-Vdd precharge method that precharges bit line pairs to Vdd/2. Although the leakage current can be substantially eliminated according to the GND precharge method because the bit line pairs share the same ground voltage as the word lines in the standby mode. However, in the active mode, the voltage of the bit line pairs must have a full amplitude between the ground voltage and the line voltage, meaning that a normal operating current will be double that in the half-Vdd precharge method. This leads to the conclusion that the GND precharge method is not effective for reducing consumption current.

An object of the present invention is to provide a dynamic semiconductor memory device capable of reducing standby current, and a bit line precharge method therefor.

Another object of the present invention is to provide a dynamic semiconductor memory device capable of reducing leakage current attributable to a defect without increasing normal operating current, and a bit line precharge method therefor.

The present invention discloses a dynamic semiconductor memory device that performs a refresh operation in a standby mode, and has a plurality of bit line pairs, a precharger, a plurality of word lines, a row decoder, and a controller. The precharger precharges the bit line pairs to a voltage that is half a line voltage. The word lines cross bit line pairs. The row decoder selectively activates the word lines. The controller activates the precharger in the standby mode, during a predetermined period before the word lines are activated, while it deactivates the precharger in other periods.

A bit line precharge method in accordance with the present invention includes a step for precharging bit line pairs to a voltage that is half a line voltage during a predetermined period in the standby mode before the word lines are activated, and a step for electrically floating bit line pairs during a period other than the predetermined period.

According to the dynamic semiconductor memory device and the bit line precharge method therefor, the word lines are activated to perform the refresh operation in the standby mode. The bit line pairs are precharged during the predetermined period before the word lines are activated, but electrically floated (not precharged) during other periods. Hence, even if the word lines are shorted with the bit lines, leakage current does not flow between the word lines and bit lines. This allows standby current to be reduced. In addition, the bit line pairs are precharged to a voltage that is half a line voltage, as in the conventional precharge method, so that normal operating current does not increase in an active mode.

DETAILED DESCRIPTION

Figure 1:
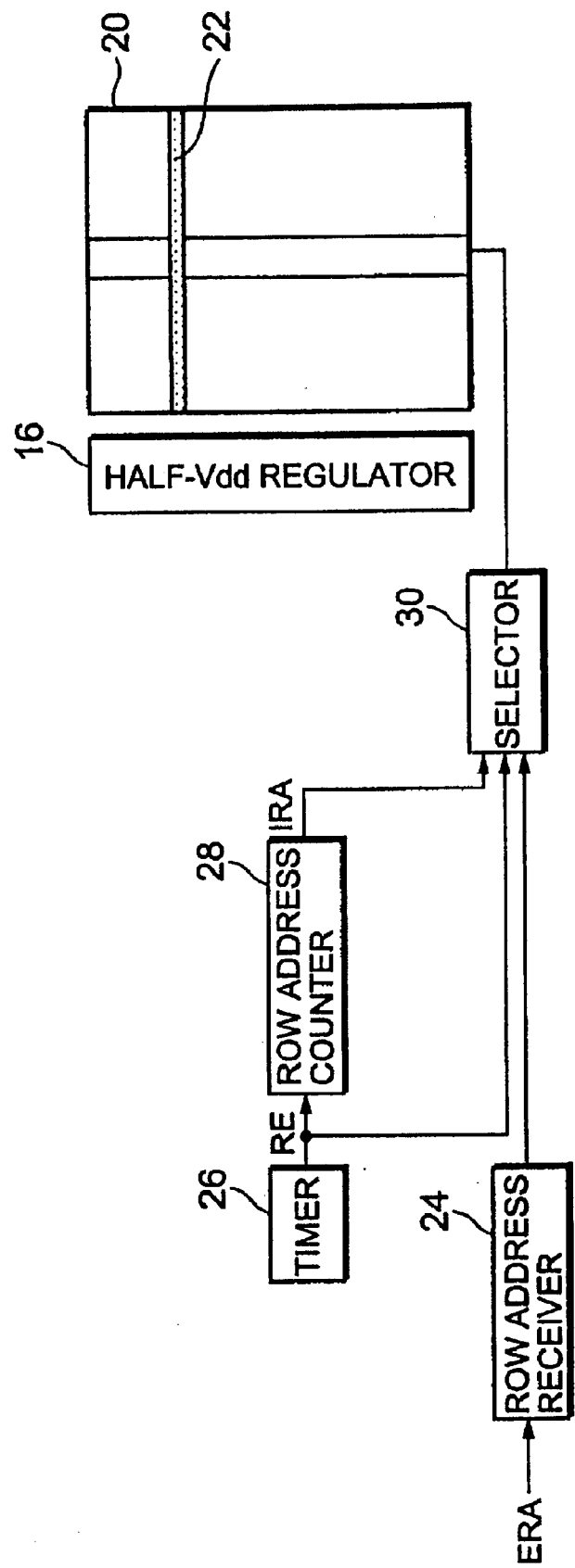
FIG. 1 shows a functional block diagram of a DRAM in accordance with a first embodiment of the present invention.

Embodiments according to the present invention will now be explained in detail with reference to the accompanying drawings. Like or equivalent elements will be assigned like reference numerals or characters and the descriptions thereof will be reused.

Referring to FIG. 1, a DRAM in accordance with the first embodiment has a memory cell array 20, a half-Vdd regulator 16, a row address receiver 24, a timer 26, a row address counter 28, and a selector 30. The memory cell array 20 is divided into a plurality of blocks 22. The half-Vdd regulator 16 generates a voltage Vdd/2, which is half a line voltage, and supplies it to the memory cell array 20.

Figure 2:
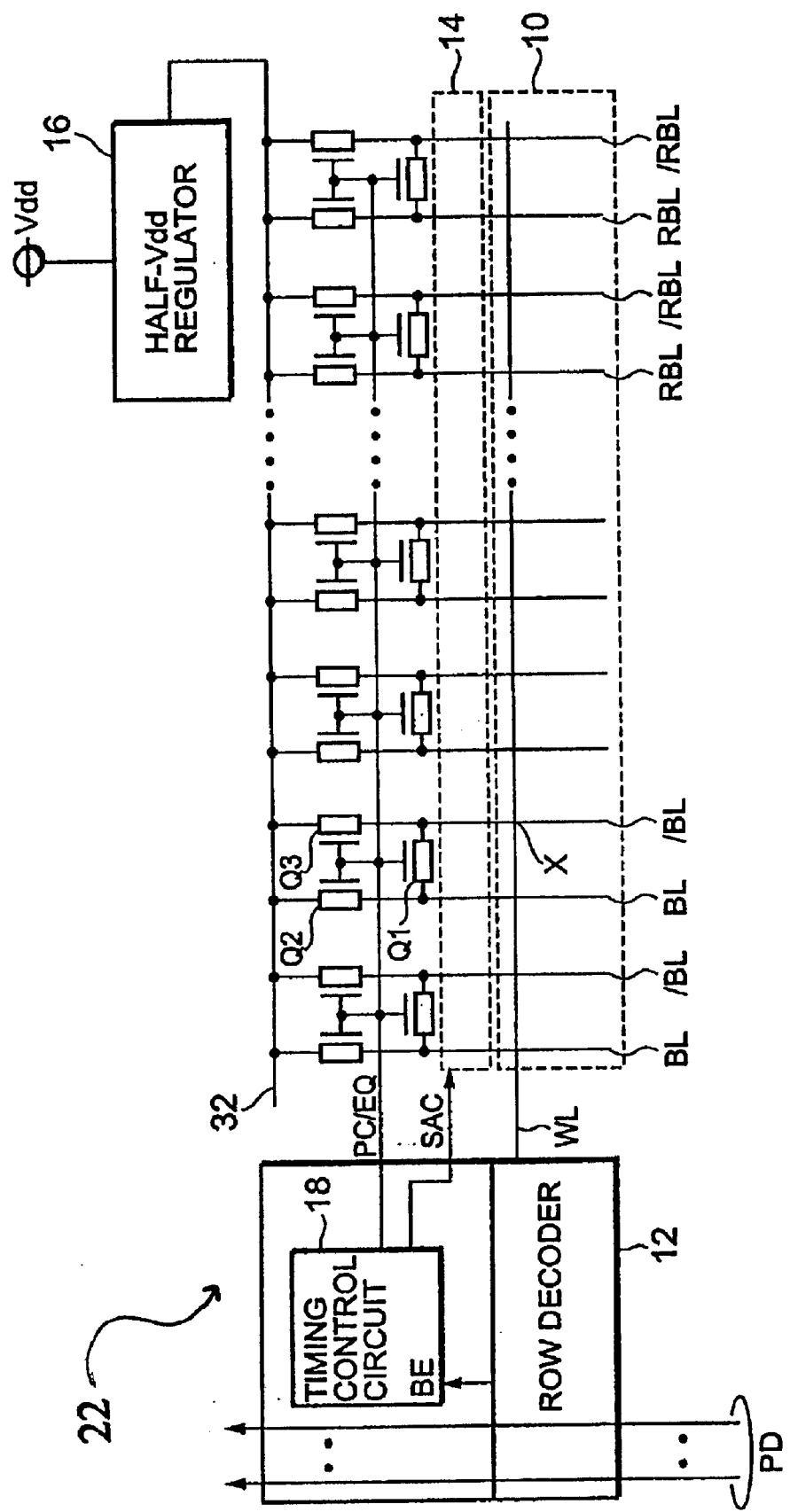
FIG. 2 illustrates a functional block diagram of an individual DRAM block.

Referring to FIG. 2, each block 22 includes a memory cell array 10 that has memory cells (not shown) arranged in rows and columns, a plurality of word lines WL disposed in rows, a plurality of bit line pairs BL, /BL that are disposed in columns and cross the word lines WL, a row decoder 12 that selectively activates the word lines WL in response to a predecode signal PD, a sense amplifier 14 that amplifies a potential difference between a bit line BL and a bit line /BL, transistors Q1 to Q3 for precharging the bit line pairs BL, /BL to Vdd/2, and a timing control circuit 18 for controlling the sense amplifier 14 and the transistors Q1 to Q3.

The transistor Q1 is connected between the bit line BL and the bit line /BL. The transistor Q2 is connected between the bit line BL and a half-Vdd line 32. The transistor Q3 is connected between the bit line /BL and the half-Vdd line 32. The half-Vdd line 32 is connected to an output end of the half-Vdd regulator 16. A precharge/equalize signal PC/EQ is commonly supplied to the gates of transistors Q1 to Q3. The transistors Q1 to Q3 turn on/off in response to the precharge/equalize signal PC/EQ.

Referring back to FIG. 1, the row address receiver 24 receives an input external row address signal ERA. The timer 26 supplies a refresh enable signal RE to the row address counter 28 and the selector 30 in a predetermined refresh cycle (e.g., 15.6 μs). The row address counter 28 generates and retains an internal row address signal IRA. The internal row address signal IRA is incremented in response to the refresh enable signal RE. In a normal access mode, the selector 30 selects the external row address signal ERA from the row address receiver 24. In a standby mode, the selector 30 selects the internal row address signal IRA from the row address counter 28 in response to the refresh enable signal RE.

The row address signal ERA or IRA selected by the selector 30 is supplied to a predecoder (not shown) in the memory cell array 20. The predecoder translates the row address signal ERA or IRA, and supplies a predecode signal PD to the row decoder 12 and a block enable signal BE to the timing control circuit 18. The timing control circuit 18 is activated in response to the block enable signal BE, and selects the block 22.

Figure 3:
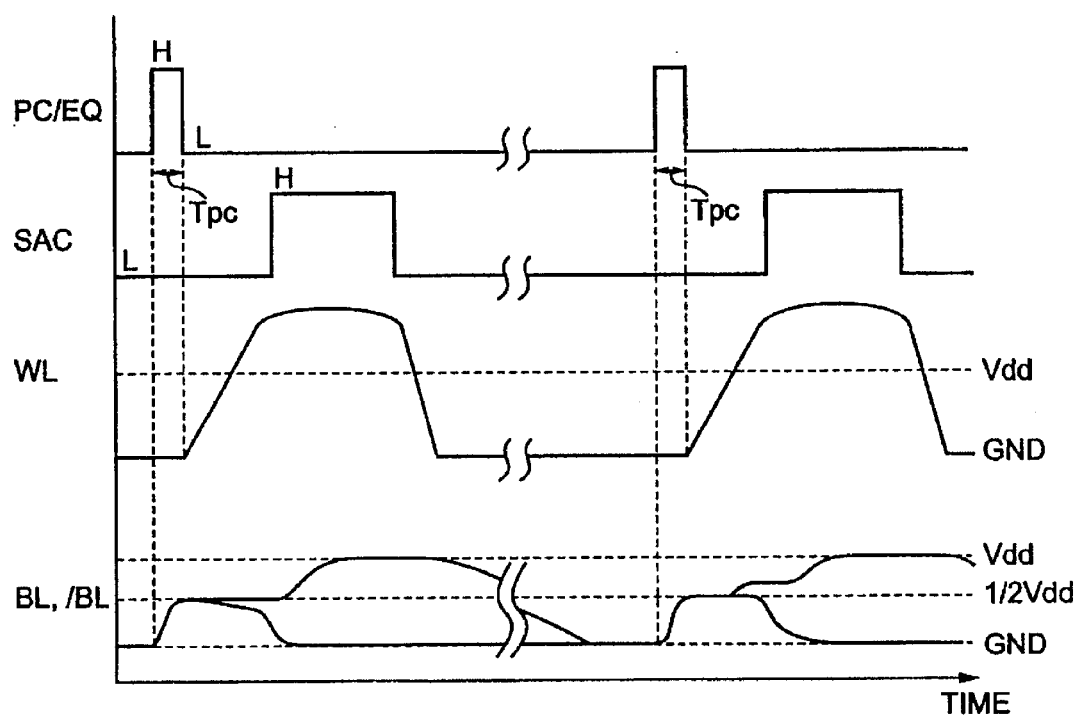
FIG. 3 shows a timing chart corresponding to a refresh operation of the DRAM shown in FIGS. 1 and 2.
Figure 13:
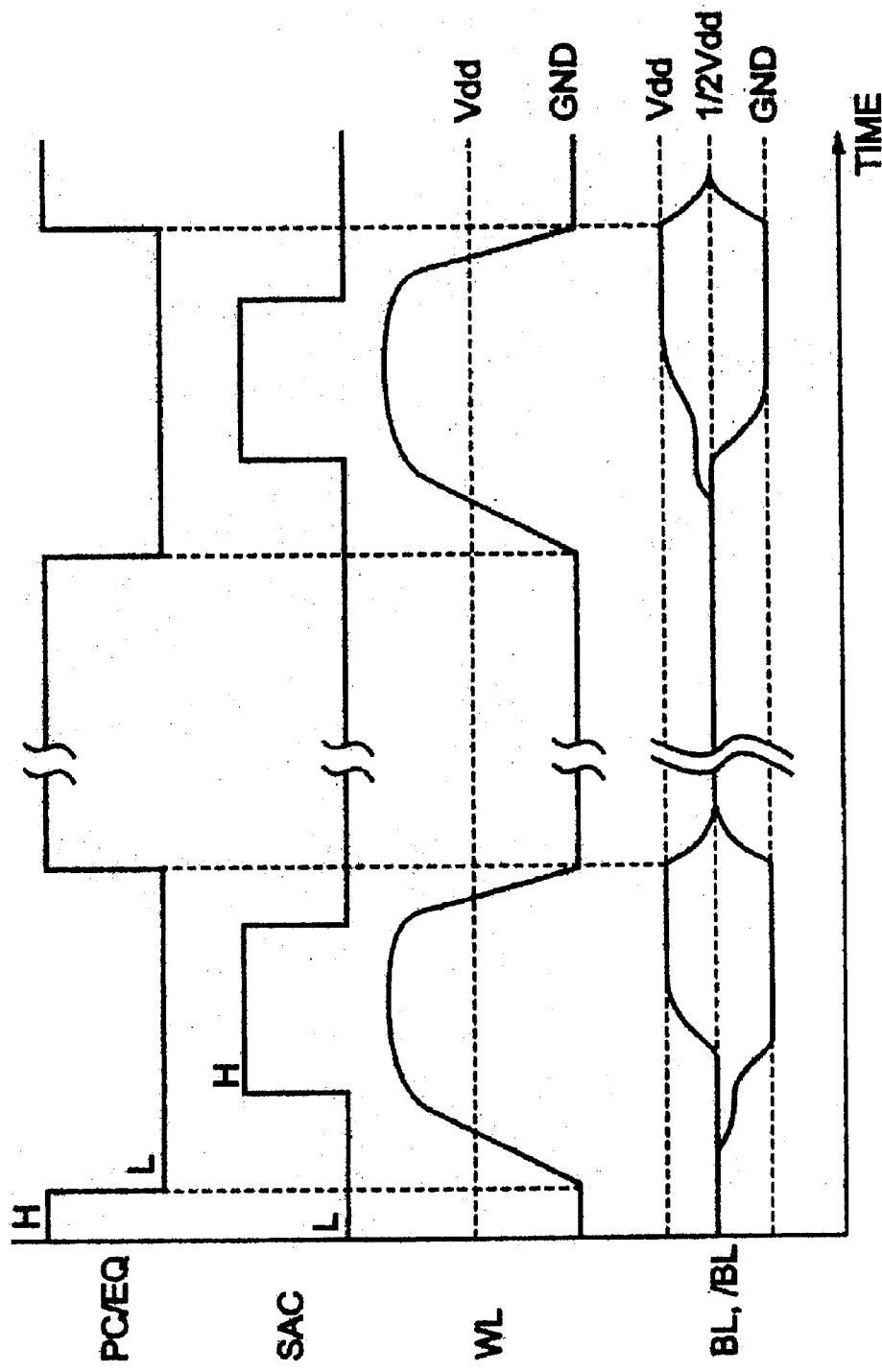
FIG. 13 shows a timing chart corresponding to a refresh operation of the DRAM shown in FIG. 12.
Figure 14:
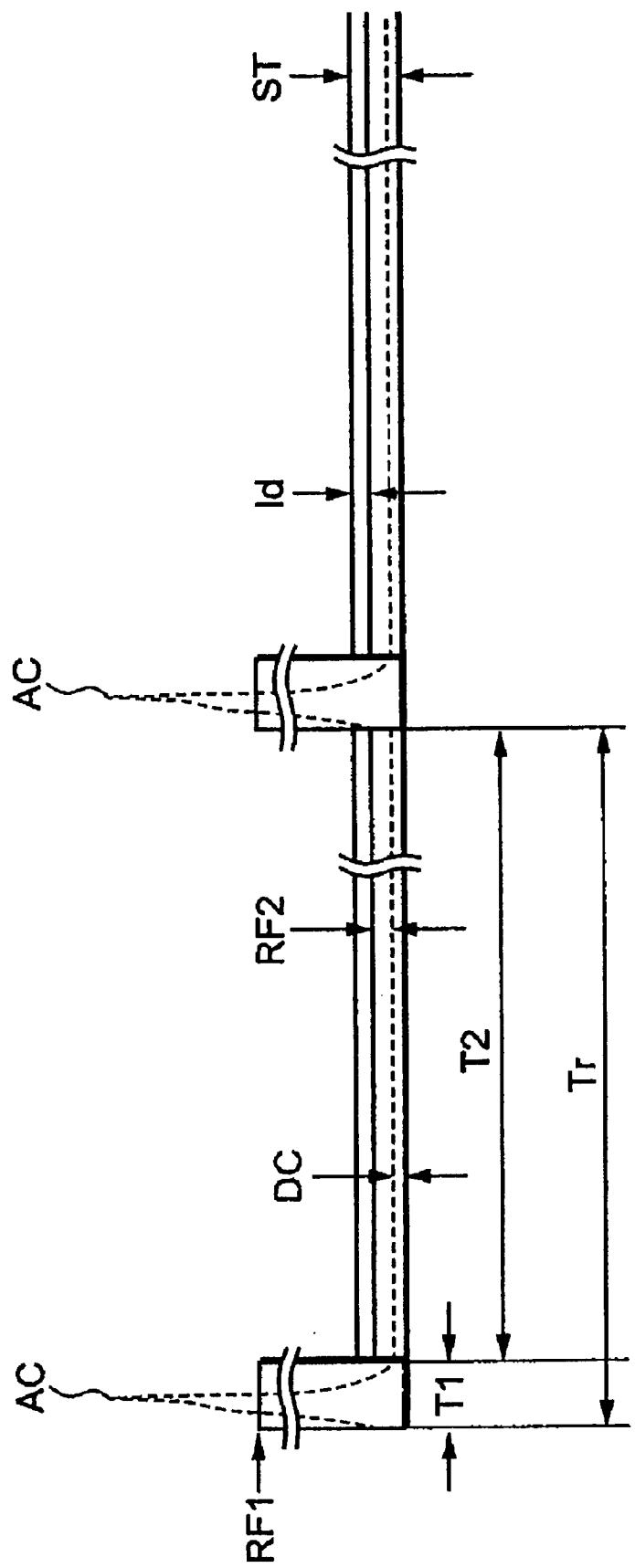
FIG. 14 depicts a waveform diagram showing consumption current in a standby mode of the DRAM shown in FIG. 12.

The refresh operation of the DRAM in the standby mode is shown in FIG. 13. The conventional precharge/equalize signal PC/EQ continuously remains at a logic high level during the period from the moment the word lines WL are deactivated to the moment they are activated. The precharge/equalize signal PC/EQ in accordance with the present embodiment transitions to a logic high only during a predetermined period Tpc before the word lines WL are activated, while it is maintained at a logic low during other periods, as shown in FIG. 3.

When the timing control circuit 18 sets the precharge/equalize signal PC/EQ to a logic high, the transistors Q1 to Q3 turn on at the same time. This causes the bit line pairs BL, /BL to be connected to the half-Vdd line 32 and also causes the bit line BL and the bit line /BL to be shorted with each other, thus precharging the bit line pair BL, /BL to Vdd/2.

When the precharge/equalize signal PC/EQ returns to a logic low, the row decoder 12 activates the word line WL. When the voltage of the word line WL rises to a level higher than the line voltage Vdd, data is read from a memory cell, producing a potential difference between the paired bit lines BL, /BL. When the timing control circuit 18 sets a sense amplifier control signal SAC to a logic high, the sense amplifier 14 is enabled. The sense amplifier 14 raises the voltage of a higher-bit line to the line voltage Vdd, while it lowers the voltage of a lower-bit line to a ground voltage GND. This causes data to be rewritten to the memory cell, thereby accomplishing the refresh operation.

Subsequently, the timing control circuit 18 sets the sense amplifier control signal SAC to a logic low, the row decoder 12 deactivates the word line WL, and the voltage of the word line WL returns to ground potential GND. As soon as the word line WL is deactivated, the conventional precharge/equalize signal PC/EQ switches to a logic high, whereas the precharge/equalize signal PC/EQ according to the present embodiment remains at a logic low level. Hence, the bit line pair BL, /BL will not be precharged and is maintained in an electrically floated state. This causes the voltage Vdd of the higher-bit line to gradually decrease toward the ground voltage GND.

Then, the timing control circuit 18 again sets the precharge/equalize signal PC/EQ to a logic high but only for the predetermined period Tpc before the word line WL is activated.

According to the present embodiment, even if the word line WL is shorted with the bit line /BL at an intersection X shown in FIG. 2, the precharge/equalize signal PC/EQ remains at a logic low for a period other than the predetermined period Tpc. Thus, the bit line pair BL, /BL is disconnected from the half-Vdd line 32 and therefore not precharged to Vdd/2. Unlike the conventional case, leakage current does not flow between the bit line /BL and the word line WL. Moreover, the present embodiment employs the half-Vdd precharge method in which the bit line pairs BL, /BL are precharged to Vdd/2, as in the conventional case, thus obviating the need for full amplitude of the voltage of the bit line pairs BL, /BL between the ground voltage GND and the line voltage Vdd. Hence, unlike the GND precharge method in which the bit line pairs BL, /BL are precharged to the ground voltage GND, active current will not increase, permitting an effective reduction of standby current to be achieved.

However, additional precharge current is required to precharge the bit line pairs BL, /BL from the ground voltage GND to Vdd/2 before refresh. It is therefore preferable to perform a burst refresh rather than carrying out single refresh at predetermined refresh intervals (e.g., 15.6 $\mu$s).

If, for example, a refresh operation period of time per word line is 60 ns in a case where 16 word lines are successively activated in order in one burst refresh, then one burst refresh takes 960 ns (=60 ns×16). If the burst refresh is carried out sixteen times at 15.6-$\mu$s refresh intervals, then the sixteen burst refresh operations will take 249.6 $\mu$s (=15.6 $\mu$s×16).

Such burst refresh operations do not require precharging the bit line pairs immediately before activating word lines. This means that precharging the bit line pairs only immediately before the first activation of the word lines and omitting the precharge of the bit line pairs immediately before the activation of the subsequent word lines will significantly reduce precharge current. More specifically, the precharge current will be $\frac{1}{16}$ of the conventional DRAM current when the burst refresh operation is performed 16 times, or $\frac{1}{32}$ conventional DRAM current when the burst refresh operation is performed 32 times.

If a 0.2 $\mu$m CMOS technology is used, the typical bit-line capacitance is 100 fF, Vdd/2=0.75 V, and the number of bit line pairs is 4K (=4×1024), then precharge current Ip required for precharging the bit line pairs from the ground voltage to Vdd/2 is given by the following expression: Ip=100 fF×2×4×1024×0.75V/15.6 $\mu$s=39 $\mu$A When the burst refresh operation is performed 16 times, the precharge current will be Ip=39 $\mu$A/16=2.4 $\mu$A. When the burst refresh operation is performed 32 times, the precharge current will be Ip=39 $\mu$A/32=1.2 $\mu$A.

Thus, an increase in the precharge current Ip is small, as compared with a case where the leakage current caused by a defect exceeds a few tens of $\mu$A.

Figure 4:
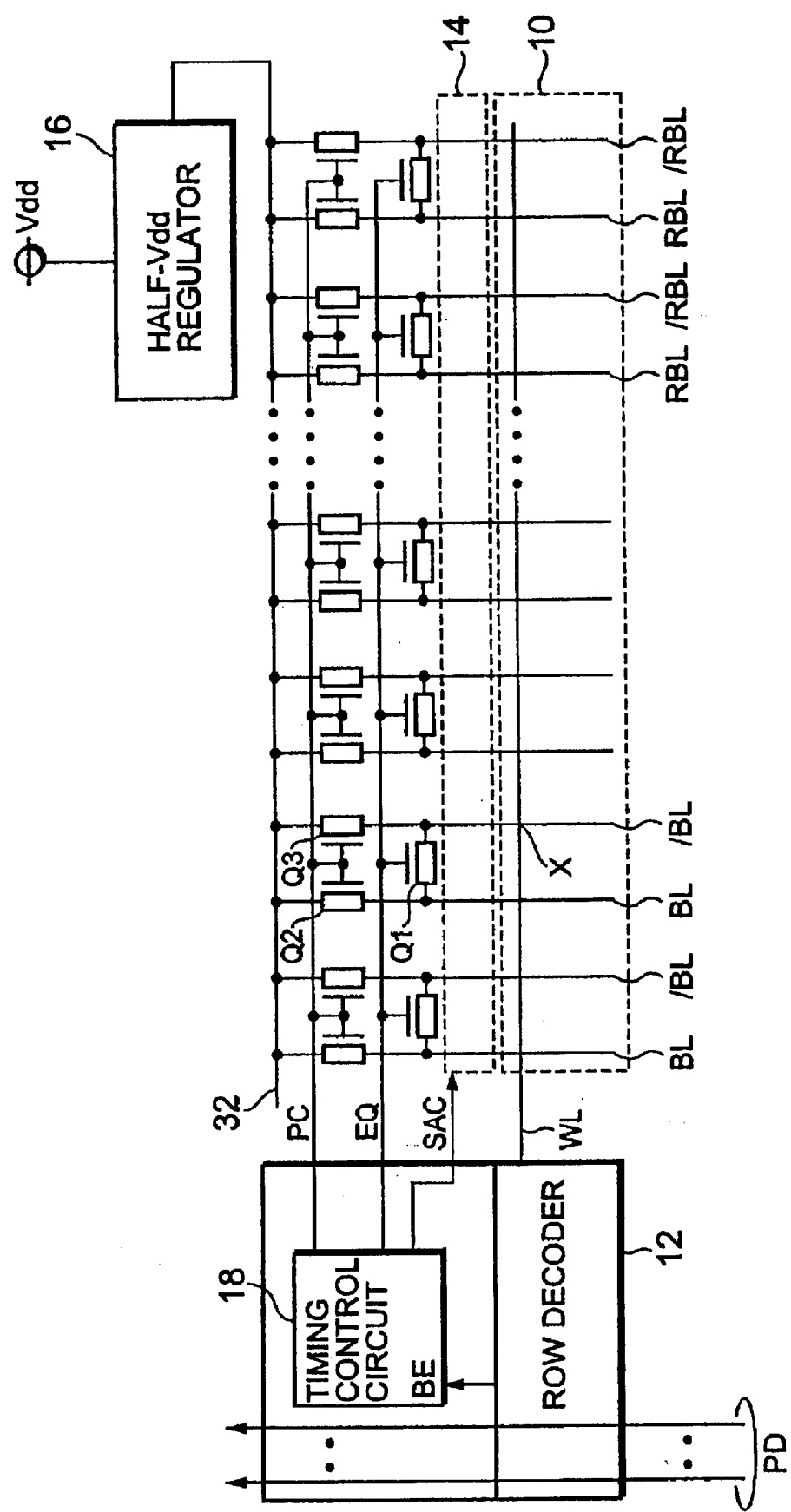
FIG. 4 illustrates a functional block diagram of a partial configuration of a DRAM according to a second embodiment of the present invention.
Figure 5:
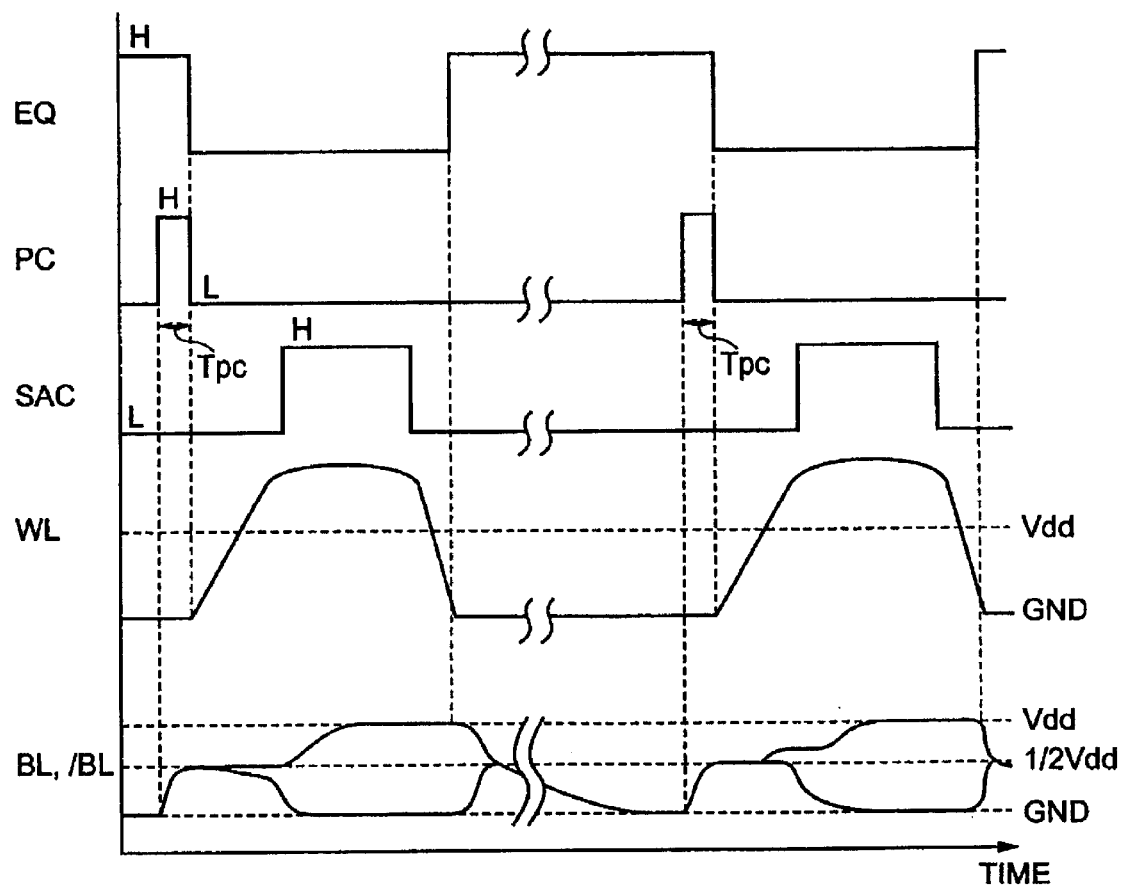
FIG. 5 shows a timing chart corresponding to a refresh operation of the DRAM shown in FIG. 4.

The invention according to a second embodiment is shown in FIG. 4. A timing control circuit 18 issues two discrete signals for the equalize signal EQ and precharge signal PC functions. This approach differs from the first embodiment described above in that the precharge PC and equalize EQ signals are combined. The equalize signal EQ is commonly supplied to the gates of transistors Q1, and the precharge signal PC is commonly supplied to transistors Q2 and Q3. Referring to FIG. 5, the equalize signal EQ changes in the same manner as the conventional precharge/equalize signal PC/EQ (FIG. 13), and the precharge signal PC changes in the same manner as the precharge/equalize signal PC/EQ (FIG. 3) in the aforementioned first embodiment.

When the word line WL is deactivated, the equalize signal EQ transitions to a logic high level, whereas the precharge signal PC remains low. When the equalize signal EQ transitions a logic high level, the transistor Q1 turns on, causing a bit line BL and a bit line /BL to be shorted with each other. Since the precharge signal PC remains at a logic low, the transistors Q2 and Q3 remain off. Thus, a bit line pair BL, /BL is floated and not precharged by a half-Vdd regulator 16. Accordingly, even if the word line WL is shorted with the bit line /BL at an intersection X shown in FIG. 4, no leakage current flows between the bit line /BL and the word line WL.

The precharge signal PC is set to a logic high for a predetermined period Tpc before the word line WL is activated. At this time, the equalize signal EQ maintains a logic high level. When the precharge signal PC is set to a logic high, the transistors Q2 and Q3 turn on, causing the bit line pair BL, /BL to be precharged to Vdd/2 by the half-Vdd regulator 16. When the equalize signal EQ and the precharge signal PC are both reset to a logic low, the voltage of the word line WL increases.

As described above, according to the second embodiment, the precharge signal PC is set to a logic low outside the period Tpc immediately before the word line WL is activated, and the bit line pair BL, /BL is disconnected from the half-Vdd line 32. This arrangement prevents leakage current attributable to a defect from flowing, thus achieving a substantially reduced standby current.

Figure 6:
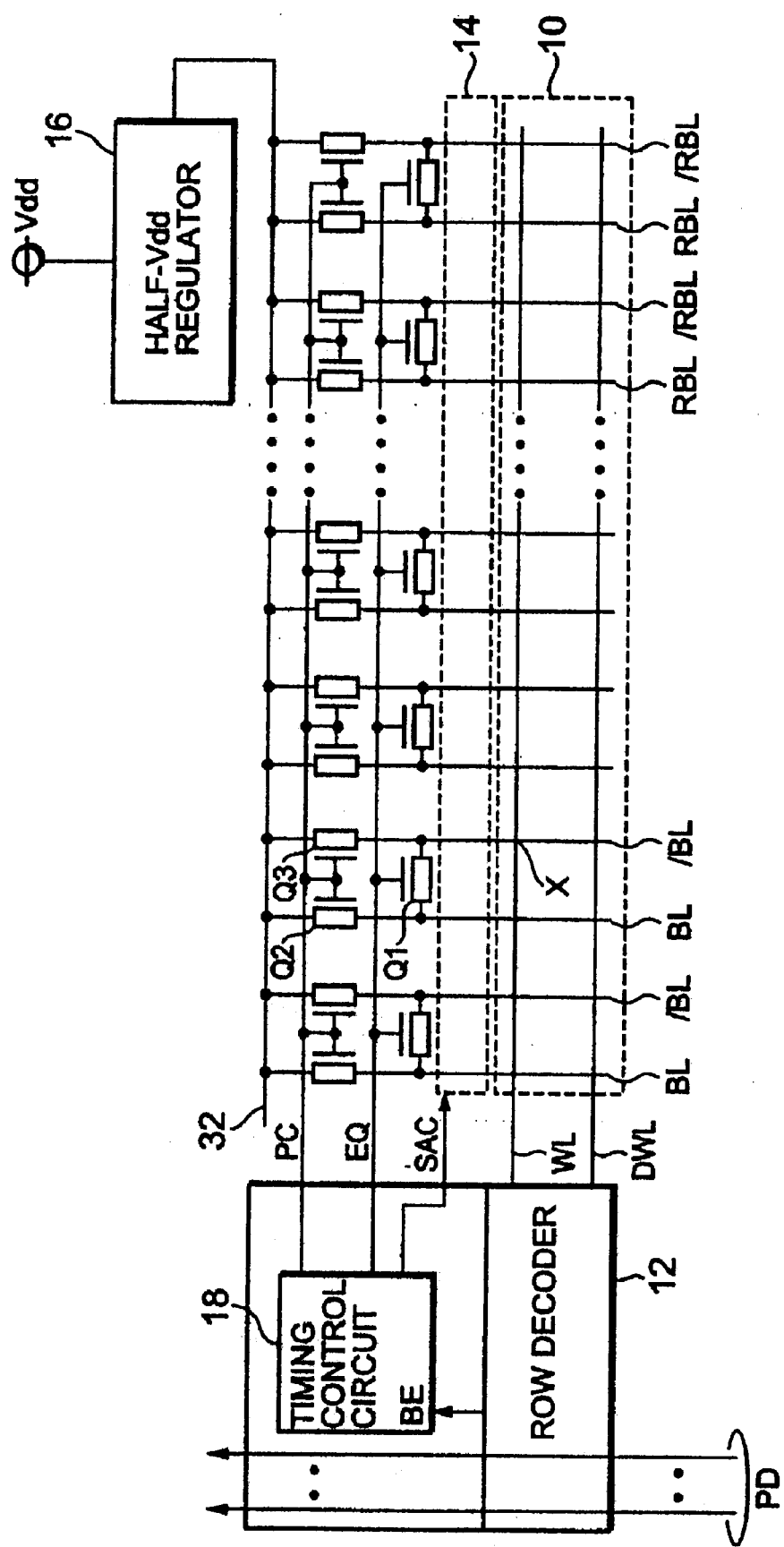
FIG. 6 illustrates a functional block diagram of a partial configuration of a DRAM according to a third embodiment of the present invention.

A third embodiment, shown in FIG. 6, provides a dummy word line DWL along a standard word line WL. The dummy word line DWL is normally provided at an end of a memory cell array 10 to maintain the regularity of layout, and not intended to be used for reading or writing data. In the present embodiment, the dummy word line DWL is activated to perform a dummy read operation.

Figure 7:
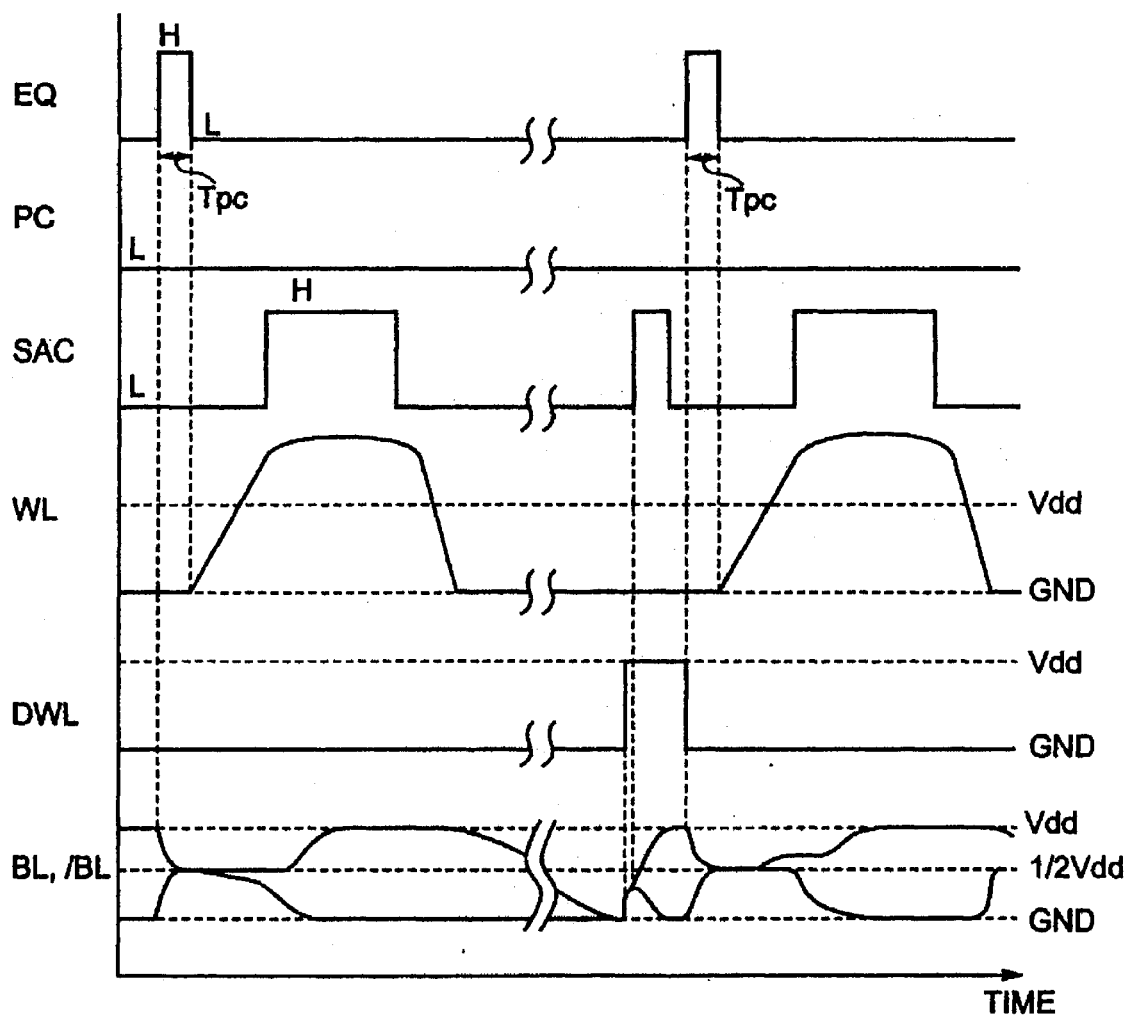
FIG. 7 shows a timing chart corresponding to a refresh operation of the DRAM shown in FIG. 6.

More specifically, a timing control circuit 18 sets an equalize signal EQ to a logic high level during a predetermined period Tpc immediately before activating the word line WL, and always maintains a precharge signal PC at a logic low level in the standby mode, as illustrated in FIG. 7. A row decoder 12 activates the dummy word line DWL before activating the word line WL. In this case, since no actual data reading is performed, the row decoder 12 has to raise the voltage of the dummy word line DWL only as high as a line voltage Vdd, and does not have to boost it more than the line voltage Vdd. While the dummy word line DWL is being activated, the timing control circuit 18 sets a sense amplifier control signal SAC to a logic high level.

When the dummy word line DWL is activated, data is read from a dummy memory cell (not shown) connected to the dummy word line DWL to a bit line pair BL, /BL. The data, which may be any data, causes a potential difference between the paired bit lines BL, /BL. When the sense amplifier control signal SAC goes high, a sense amplifier 14 is activated, amplifying the abovementioned potential difference. This raises the voltage of a higher-bit line to the line voltage Vdd, while it reduces the voltage of a lower-bit line to the ground voltage GND.

When the equalize signal EQ goes high after the sense amplifier control signal SAC returns to a logic low and the voltage of the dummy word line DWL is set back to the ground voltage GND, the transistor Q1 turns on, causing the bit line BL and the bit line /BL to be shorted with each other. This equalizes the voltage of the bit line pair BL, /BL to Vdd/2. After the equalize signal EQ falls to a logic low, the voltage of the word line WL rises.

As described above, according to the third embodiment, the precharge signal PC is always maintained low in the standby mode to disconnect the bit line pairs BL, /BL from the half-Vdd line 32, thus preventing leakage current attributable to a defect from flowing. As a result, the standby current can be reduced. Although the precharge signal PC is always maintained at a logic low in the standby mode, the bit line pairs BL, /BL can be precharged to Vdd/2 since the dummy word line DWL is enabled and the sense amplifier 14 is activated before the word line WL is enabled.

Figure 8:
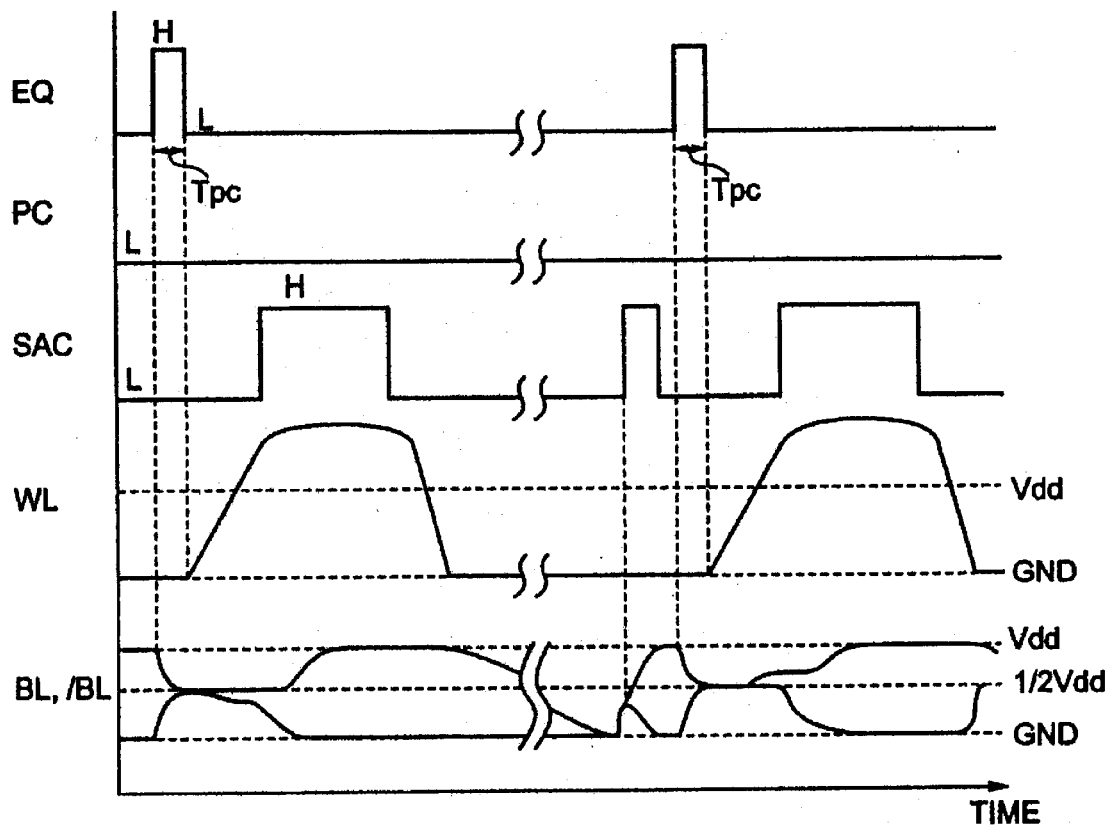
FIG. 8 shows a timing chart corresponding to a DRAM refresh operation according to a fourth embodiment of the present invention.

The timing diagram corresponding to a fourth embodiment is shown in FIG. 8. Note that the dummy read operation described in the third embodiment is performed using the dummy word line DWL to precharge the bit line pairs BL, /BL to Vdd/2. If, however, no dummy word line DWL is provided, then the sense amplifier 14 may simply be activated. More specifically, as shown in FIG. 8, a timing control circuit 18 sets a sense amplifier control signal SAC to a logic high immediately before the voltage of the bit line pair BL, /BL is equalized.

If a sense amplifier control signal SAC goes high when none of the word lines WL have been enabled, the sense amplifier 14 is activated. At this time, no data is read from the bit line pair BL, /BL, but a slight potential difference naturally exists between the paired bit lines BL, /BL. The sense amplifier 14 amplifies the potential difference to raise the voltage of the higher-bit line to the line voltage Vdd and to reduce the voltage of the lower-bit line to the ground voltage GND. The bit line pair BL, /BL are equalized and precharged to Vdd/2 when the equalize signal EQ goes high after the sense amplifier control signal SAC returns to a logic low to deactivate the sense amplifier 14.

Figure 9:
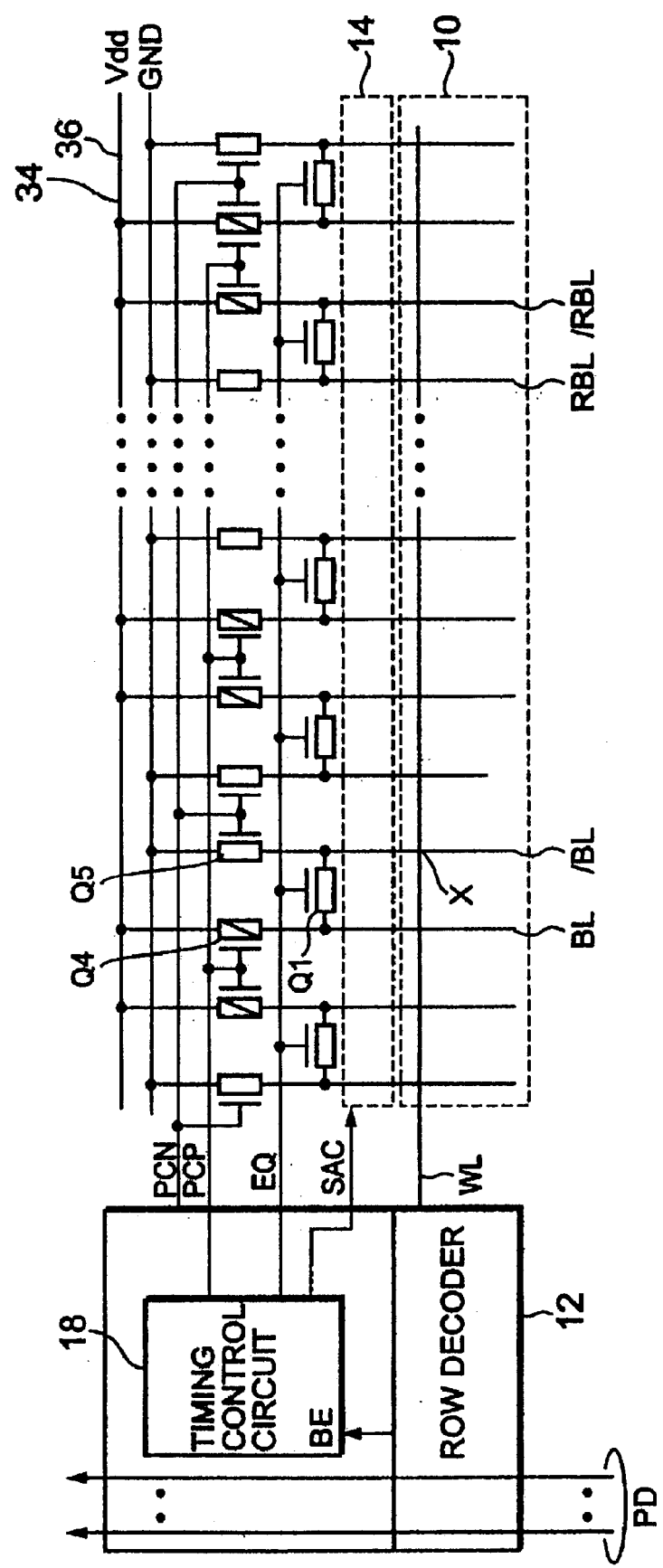
FIG. 9 illustrates a partial configuration block diagram of a DRAM according to a fifth embodiment of the present invention.

A fifth embodiment, shown in FIG. 9, provides a power line 34 and a grounding conductor 36 in place of the half-Vdd regulator 16 in the previously described embodiments. A line voltage Vdd is supplied to the power line 34, and a ground voltage GND is supplied to the grounding conductor 36. A P-channel MOS transistor Q4 is connected between the power line 34 and a bit line BL. An N-channel MOS transistor Q5 is connected between the grounding conductor 36 and a bit line /BL. A precharge signal PCP is commonly supplied to the gates of a plurality of transistors Q4. A precharge signal PCN is commonly supplied to the gates of a plurality of transistors Q5. The transistors Q4 turned on/off in response to the precharge signal PCP, and the transistors Q5 turn on/off in response to the precharge signal PCN.

Figure 10:
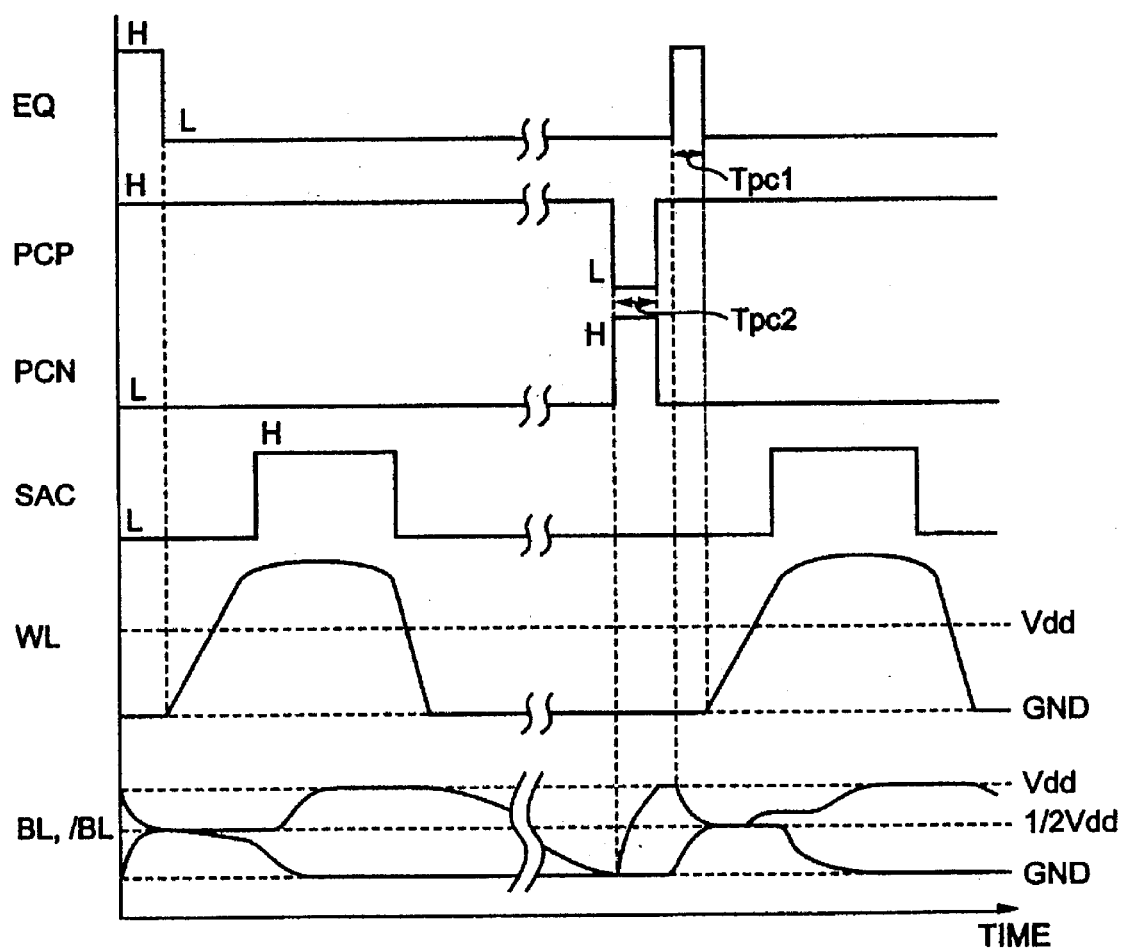
FIG. 10 shows a timing chart corresponding to a refresh operation of the DRAM shown in FIG. 9.

A timing control circuit 18 sets an equalize signal EQ high during a predetermined period Tpc1 immediately before a word line WL is enabled, as shown in FIG. 10. The timing control circuit 18 further sets the precharge signal PCP low and sets the precharge signal PCN high during a predetermined period Tpc2 immediately before the equalize signal EQ switches high.

When the precharge signal PCP goes low, the transistor Q4 turns on, causing one bit line BL to be connected to the power line 34 so as to be precharged to the line voltage Vdd. At the same time, when the precharge signal PCN switches high, the transistor Q5 turns on, causing the other bit line /BL to be connected to the grounding conductor 36 so as to be precharged to the ground voltage GND. When the precharge signal PCP returns to a logic high, while the precharge signal PCN returns to a logic low, and the equalize signal EQ switches high, the bit line pair BL, /BL is equalized and precharged to Vdd/2. In other words, one bit line BL is temporarily connected to the power line 34 and the other bit line /BL is temporarily connected to the grounding conductor 36. After the bit line pair BL, /BL is isolated from the power line 34 and the grounding conductor 36, one bit line BL and the other bit line /BL are shorted with each other.

As described above, according to the fifth embodiment, the precharge signal PCP is set high and the precharge signal PCN is set low to disconnect the bit line pair BL, /BL from the power line 34 and the grounding conductor 36 during a period other than the predetermined period Tpc2 before the word line WL is enabled. This prevents the flow of leakage current attributable to a defect from occurring. As a result, the standby current can be significantly reduced. In addition, the absence of the half-Vdd regulator 16 contributes to a reduction in power consumption.

Figure 11:
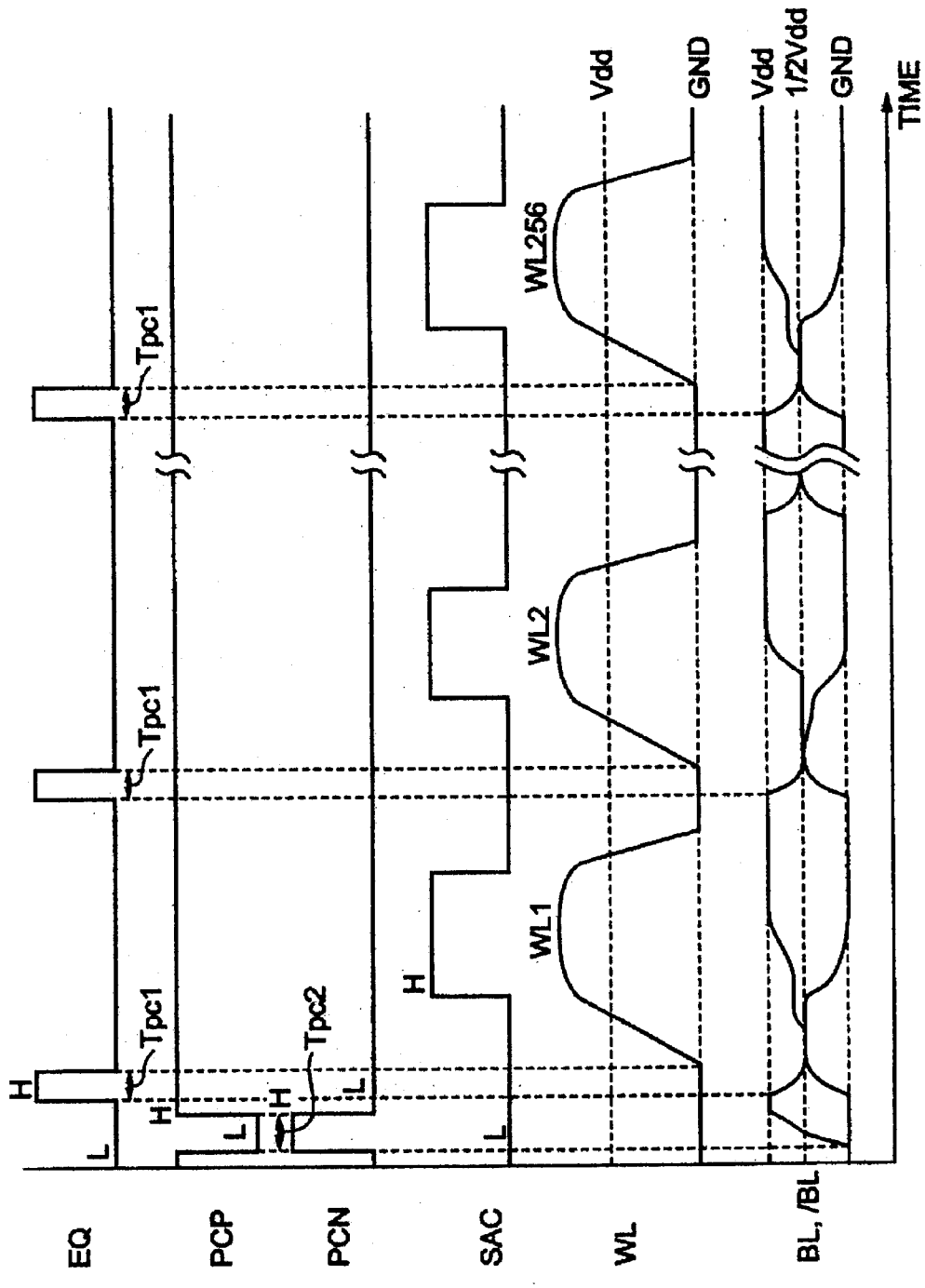
FIG. 11 shows a timing chart corresponding to a DRAM refresh operation according to a sixth embodiment of the present invention.
Figure 12:
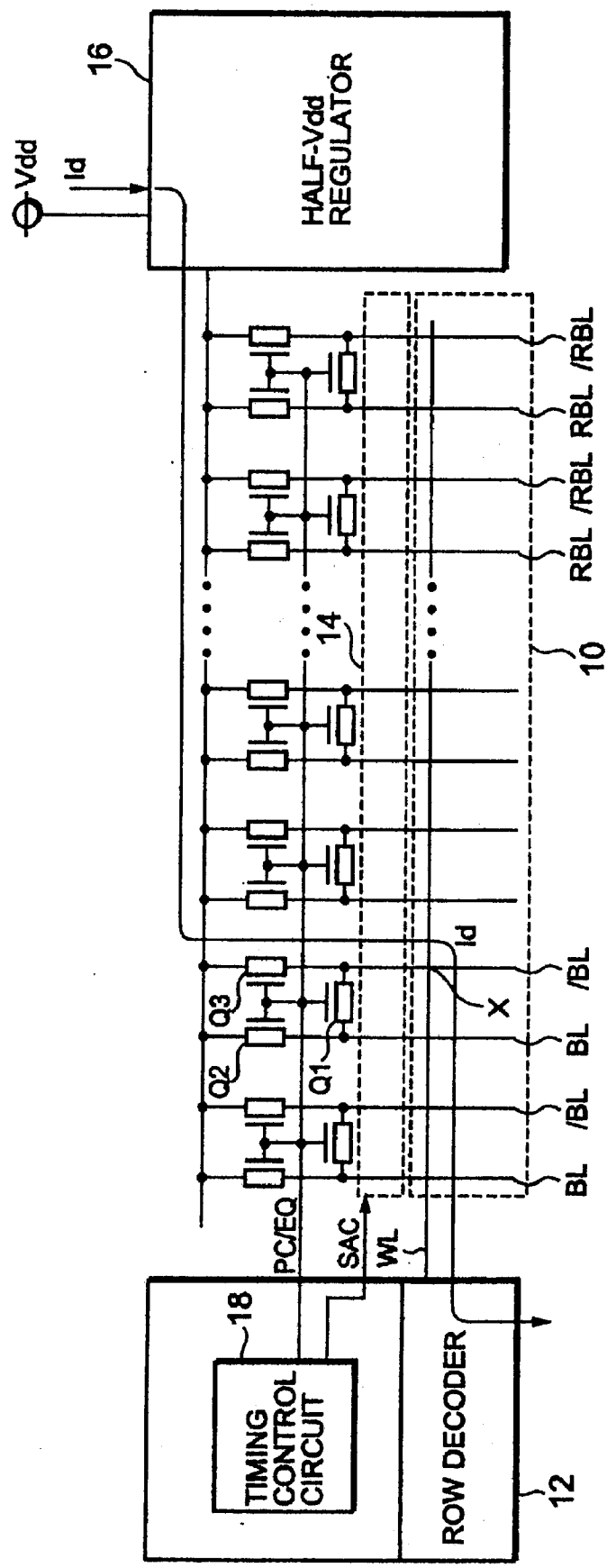
FIG. 12 illustrates a functional block diagram of a partial configuration of a conventional DRAM.

A timing diagram corresponding to a sixth embodiment is shown in FIG. 11. In the previous embodiment, the voltage of the bit line pair BL, /BL exhibits full amplitude swing between the ground voltage GND and the line voltage Vdd each time before the word line WL is activated. However, this is unnecessary in a burst refresh operation in which all word lines WL in the memory cell array 10 are successively activated in order. As shown in FIG. 11, the voltage of the bit line pair BL, /BL attains full amplitude only before a first word line WL1 is activated, but no longer has full amplitude preceding the activation of subsequent word lines WL2 to WL256.

To be more specific, a timing control circuit 18 sets a precharge signal PCP low and a precharge signal PCN high during a predetermined period Tpc2 before the first word line WL1 is enabled. This causes the voltage of the bit line pair BL, /BL to have full amplitude, and one bit line BL is precharged to a line voltage Vdd, while the other bit line /BL is precharged to the ground voltage GND. Subsequently, when the equalize signal EQ goes high, the bit line pair BL, /BL is equalized and precharged to Vdd/2.

Hitherto, if a word line WL was shorted with the bit line /BL at with resistance of 5 kΩ and if Vdd=1.6V, then Id=1.6V/2/5kΩ=160 µA. Furthermore, if Re=0.8, then ID=160 µA/0.8=200 µA. Accordingly, if there are any such defects, the requirements of a low-current DRAM cannot be satisfied.

According to the sixth embodiment, if, for example, Vdd is 1.6 V, the number of word lines is 256, a sense amplifier is activated for 10 ns, and the retention time during which a memory cell can hold data is 64 ms, then an increase in DC current in a standby mode will be controlled to 0.013 µA (=1.6V/5kΩ×256×10 ns/64 ms). Hence, even if there are 100 defects, such as the ones mentioned above, an increase in the DC current will be 1.3 µA. This makes it possible to fabricate low-current DRAMs with higher yields without the need for paying much attention to defects.

While the invention has been described in detail, the foregoing description is in all aspects illustrative and not restrictive. It is understood that numerous other modifications and variations can be devised without departing from the scope of the invention.

What is claimed is:

1. A dynamic semiconductor memory device performing a refresh operation in a standby mode, comprising:
   a plurality of bit line pairs;
   a precharge circuit capable of precharging the bit line pairs to a voltage that is half a line voltage;
   a plurality of word lines;
   a row decoder that selectively activates the word lines; and
   a timing control circuit that activates the precharge circuit during a short predetermined period in the standby mode immediately before the word lines are activated, and deactivates the precharge circuit in a period other than the predetermined period.

2. The dynamic semiconductor memory device according to claim 1, includes:
   a voltage generator circuit capable of generating a voltage that is half the line voltage.

3. The dynamic semiconductor memory device according to claim 2, wherein the precharge circuit includes:
   a first switching element connected between paired bit lines of each of the bit line pairs;
   a second switching element connected between an output end of the voltage generator circuit and one of the paired bit lines; and
   a third switching element connected between the output end of the voltage generator circuit and the other of the paired bit lines.

4. The dynamic semiconductor memory device according to claim 3, wherein the timing control circuit turns the second and third switching elements on during the predetermined period and turns them off during a period other than the predetermined period.

5. The dynamic semiconductor memory device according to claim 3, wherein the timing control circuit turns the first switching element on after the word lines are deactivated, and turns off the first switching element before the word lines are activated.

6. The dynamic semiconductor memory device according to claim 3, includes:
   a voltage generator circuit for generating a voltage that is half the line voltage;
   a sense amplifier for amplifying a potential difference between the paired bit lines; and
   a dummy word line disposed along the word lines.

7. The dynamic semiconductor memory device according to claim 6, wherein:
   the row decode activates the dummy word line after the word lines are deactivated but before the predetermined period; and
   the timing control circuit turns the first switching element on during the predetermined period, turns the second and third switching elements off during the standby mode, and activates the sense amplifier while the dummy word line is being activated.

8. The dynamic semiconductor memory device according to claim 3, includes:
   a voltage generator circuit for generating a voltage that is half the line voltage; and
   a sense amplifier for amplifying a potential difference between the paired bit lines.

9. The dynamic semiconductor memory device according to claim 8, wherein:
   the timing control circuit turns the first switching element on during the predetermined period, turns the second and third switching elements off during the standby mode, and activates the sense amplifier after the word lines are deactivated but before the predetermined period.

10. The dynamic semiconductor memory device according to claim 3, wherein:
    the timing control circuit turns the first switching element on during the predetermined period, and turns the second and third switching elements on after the word lines are deactivated but before the predetermined period.

11. The dynamic semiconductor memory device according to claim 3, wherein:
    the row decoder successively activates the plurality of word lines in order in the standby mode; and
    the timing control circuit turns the first switching element on during the predetermined period each time the word lines are activated, and turns the second and third switching elements on before first activation of the word lines prior to the predetermined period.

12. A bit line precharge method in a dynamic semiconductor memory device performing a refresh operation in a standby mode, comprising the following steps:

precharging a bit line pair to a voltage that is half a line voltage during a short predetermined period in the standby mode immediately before a word line is activated; and electrically floating the bit line pair during a period other than the predetermined period.

13. The bit line precharge method in a dynamic semiconductor memory device according to claim 12, wherein the step for precharging further includes:

temporarily connecting one of the paired bit lines to a power source;

temporarily connecting the other of the paired bit lines to ground; and short-circuiting the one and the other of the paired bit lines with each other after the paired bit lines are disconnected from the power source and the ground.

14. A bitline precharge method in a dynamic semiconductor memory device performing a refresh operation in a standby mode, comprising the following:

providing a plurality of bit line pairs to access a plurality of columns of the memory device;

providing a precharge circuit capable of precharging the bit line pairs to a voltage that is half a line voltage;

providing a plurality of word lines to access a plurality of rows of the memory device;

providing a row decoder that selectively activates the word lines;

coupling a first switching element between paired bit lines of each of the bit line pairs;

coupling a second switching element between an output end of a voltage generator circuit and one of the paired bit lines;

coupling a third switching element between the output end of the voltage generator circuit and the other of the paired bit lines; and providing a timing control circuit that activates the precharge circuit during a short predetermined period in the standby mode immediately before the word lines are activated, and deactivates the precharge circuit in a period other than the predetermined period.

15. The bitline precharge method of claim 14, wherein the timing control circuit turns the second and third switching elements on during the predetermined period and turns them off during a period other than the predetermined period.

16. The bitline precharge method of claim 14, wherein the timing control circuit turns the first switching element on after the word lines are deactivated, and turns off the first switching element before the word lines are activated.

17. The bitline precharge method of claim 14, wherein the timing control circuit turns the first switching element on during the predetermined period, turns the second and third switching elements off during the standby mode, and activates the sense amplifier after the word lines are deactivated but before the predetermined period.

18. The bitline precharge method of claim 14, wherein the timing control circuit turns the first switching element on during the predetermined period, and turns the second and third switching elements on after the word lines are deactivated but before the predetermined period.

19. The bitline precharge method of claim 14, wherein the row decoder successively activates the plurality of word lines in order in the standby mode; and the timing control circuit turns the first switching element on during the predetermined period each time the word lines are activated, and turns the second and third switching elements on before first activation of the word lines prior to the predetermined period.

\* \* \* \* \*